(12) United States Patent
Cusin et al.

(10) Patent No.: US 9,045,333 B2
(45) Date of Patent: *Jun. 2, 2015

(54) COMPOSITE MICROMECHANICAL COMPONENT AND METHOD OF FABRICATING THE SAME

(75) Inventors: Pierre Cusin, Villars-Burquin (CH); Jean-Philippe Thiebaud, Cudrefin (CH)

(73) Assignee: Nivarox-FAR S.A., Le Locle (CH)

( * ) Notice: Subject to any disclaimer, the term of this patent is extended or adjusted under 35 U.S.C. 154(b) by 1394 days.

This patent is subject to a terminal disclaimer.

(21) Appl. No.: 12/797,389

(22) Filed: Jun. 9, 2010

(65) Prior Publication Data

US 2010/0308010 A1  Dec. 9, 2010

(30) Foreign Application Priority Data

Jun. 9, 2009 (EP) ...................................... 09162292

(51) Int. Cl.
*B23P 15/00* (2006.01)
*C03C 25/00* (2006.01)
(Continued)

(52) U.S. Cl.
CPC ........... *B81C 99/008* (2013.01); *B81C 1/00119* (2013.01); *B81C 1/00031* (2013.01); *B81C 1/00087* (2013.01); *B81B 3/0075* (2013.01); *B81B 2201/035* (2013.01); *B81C 2201/0132* (2013.01); *B81C 2201/032* (2013.01); *C25D 1/20* (2013.01); *G04B 13/026* (2013.01); *G04D 3/0069* (2013.01); *C25D 1/003* (2013.01); *C25D 5/022* (2013.01)

(58) Field of Classification Search
None
See application file for complete search history.

(56) References Cited

U.S. PATENT DOCUMENTS 5,234,571 A * 8/1993 Noeker ........................... 205/70
5,529,681 A * 6/1996 Reinecke et al. ............... 205/70
(Continued)

FOREIGN PATENT DOCUMENTS

EP        2 060 534 A1    5/2009
JP        2005-256110     9/2005

OTHER PUBLICATIONS

Fei Wang et al., "Microcantilever Probe Cards with Silicon and Nickel Composite Micromachining Technique for Wafer-Level Burn-In Testing," IEEE Transactions on Advanced Packaging, vol. 32, No. 2, May 1, 2009, pp. 468-477.

(Continued)

*Primary Examiner* — Duy Deo
(74) *Attorney, Agent, or Firm* — Griffin & Szipl, P.C.

(57) ABSTRACT

The invention relates to a method of fabricating a composite micromechanical component, particularly for timepiece movements, including steps: a) providing a substrate including a horizontal top layer and a horizontal bottom layer made of electrically conductive, micromachinable material, and secured to each other by an electrically insulating, horizontal, intermediate layer; b) etching a pattern in the top layer through to the intermediate layer, thereby forming at least one cavity in the substrate; c) coating the top part of the substrate with an electrically insulating coating; d) directionally etching the coating and the intermediate layer to limit the presence thereof exclusively at each vertical wall; e) performing an electrodeposition by connecting the electrode to the conductive bottom layer of the substrate to form at least one metal part of the component; g) releasing the composite component from the substrate.

11 Claims, 4 Drawing Sheets

(51) Int. Cl.
  *B44C 1/00* (2006.01)
  *B81C 99/00* (2010.01)
  *B81C 1/00* (2006.01)
  *B81B 3/00* (2006.01)
  *C25D 1/20* (2006.01)
  *G04B 13/02* (2006.01)
  *G04D 3/00* (2006.01)
  *C25D 1/00* (2006.01)
  *C25D 5/02* (2006.01)

(56) References Cited

U.S. PATENT DOCUMENTS 7,887,995 B2 * 2/2011 Niwa et al. .................. 430/312
8,512,539 B2 * 8/2013 Cusin et al. .................. 205/67

OTHER PUBLICATIONS

European Search Report issued in corresponding application No. EP09162292, completed Nov. 25, 2009.

* cited by examiner

COMPOSITE MICROMECHANICAL COMPONENT AND METHOD OF FABRICATING THE SAME

This application claims priority from European Patent Application No. 09162292.8 filed Jun. 9, 2009, the entire disclosure of which is incorporated herein by reference.

FIELD OF THE INVENTION

The invention relates to a composite micromechanical component, at least one surface of which has a low friction coefficient, and a method of fabricating the same.

BACKGROUND OF THE INVENTION

EP Patent No. 2 060 534 discloses a method of fabricating a silicon-metal composite micromechanical component, obtained from photolithography using photosensitive resins, silicon etching and galvanic growth. However, this method is complex to implement for metal parts over several levels and final coating steps have to be provided to improve the tribological properties of silicon.

Moreover, a method of this type is not suitable for micromechanical components with a high slenderness ratio where a material such as nickel-phosphorus with, for example 12% phosphorus, tends to peel off. The galvanic depositions of this type of component delaminate because of inner stresses in the deposited nickel-phosphorus.

SUMMARY OF THE INVENTION

It is an object of the present invention to overcome all or part of the aforementioned drawbacks by proposing a composite micromechanical component whose useful parts are coated with a better tribological material than the micromachinable material used, and a method of fabricating such components that includes fewer steps.

The invention therefore relates to a method of fabricating a composite micromechanical component that includes the following steps:
a) providing a substrate that includes a horizontal top layer and a horizontal bottom layer made of electrically conductive, micromachinable material, secured to each other by an electrically insulating, horizontal, intermediate layer;
b) etching at least one pattern in the top layer through to the intermediate layer, so as to form at least one cavity in the substrate that will form at least one part, made of micromachinable material, of the composite component;
c) coating the top part of said substrate with an electrically insulating coating;
d) directionally etching said coating and said intermediate layer so as to limit the presence thereof exclusively at each vertical wall formed in the top layer;
e) performing an electrodeposition by connecting the electrode to the conductive bottom layer of the substrate to form at least one metallic part of the composite component;
f) releasing the composite component from the substrate.

Thus, advantageously according to the invention, deposition of the layer that is tribologically better than the micromachinable material is entirely integrated within the fabrication method and not performed subsequent to fabrication of said component.

According to other advantageous features of the invention:
after step d) a part is assembled above the top layer to form at least one recess that communicates with said at least one cavity, so as to form a second level of said component;
prior to step e), the method includes step g): assembling a pin in said at least one cavity so as to form a hole in the future composite component;
step b) includes phase h): structuring at least one protective mask on the conductive top layer, phase i): performing an anisotropic etch of said top layer over the parts that are not protected by said at least one protective mask, and phase j): removing said at least one protective mask;
prior to step e), the method includes step g): assembling a pin in said at least one cavity so as to form a hole in the future composite component;
prior to step f), the method includes step b'): etching a pattern in the bottom layer though to said metal part so as to form at least a second cavity in said substrate, step c'): coating the bottom part of said substrate with a second electrically insulating coating, and step e'): performing an electrodeposition by connecting the electrode to the conductive bottom layer of the substrate so as to finish forming the metal parts of said component;
after step c'), the method includes step d'): directionally etching said second coating so as to reveal exclusively the bottom of the bottom layer;
a part is assembled after step d') so as to form at least one recess that communicates with said at least one second cavity, offering a second additional layer to said component;
prior to step e') the method includes step g'): assembling a pin in said at least one second cavity of the bottom layer so as to form a hole in the future composite component;
step b') includes phase h'): structuring at least one protective mask on the conductive bottom layer, phase i'): performing an anisotropic etch of said bottom layer in the parts that are not protected by said at least one protective mask, and phase j'): removing the protective mask;
several composite micromechanical components are fabricated on the same substrate;
the conductive layers include a doped silicon-based material.

The invention also relates to a composite micromechanical component that includes a horizontal silicon part, which includes a hole receiving a metal part, characterized in that the silicon part is formed by doped silicon and includes at least one vertical part for transmitting a mechanical force that is coated with silicon dioxide to improve the tribological qualities of said doped silicon. This component can advantageously be used for transmitting forces via its silicon-dioxide coated silicon part, for example by being driven in at the metal part.

In accordance with other advantageous features of the invention:
the metal part includes a portion that projects from said silicon part so as to form a uniquely metal level above the silicon part;
said silicon part cooperates, via a silicon dioxide layer, with a second silicon part;
the second silicon part is formed by doped silicon and has vertical, silicon-dioxide walls to improve the tribological qualities of said doped silicon;
the second silicon part includes at least one hole for receiving a second metal part;

said second metal part includes a portion that projects from said second silicon part so as to form a uniquely metal level below the second silicon part;

each metal part includes a hole for driving said component against a pivot.

Finally, the invention also relates to a timepiece that includes a composite micromechanical component in accordance with one of the preceding variants, wherein at least one silicon part forms a wheel or escapement pallets.

BRIEF DESCRIPTION OF THE DRAWINGS

Other features and advantages will appear clearly from the following detailed description, given by way of non-limiting indication, with reference to the annexed drawings, in which.

DETAILED DESCRIPTION OF PREFERRED EMBODIMENTS

Figure 14:
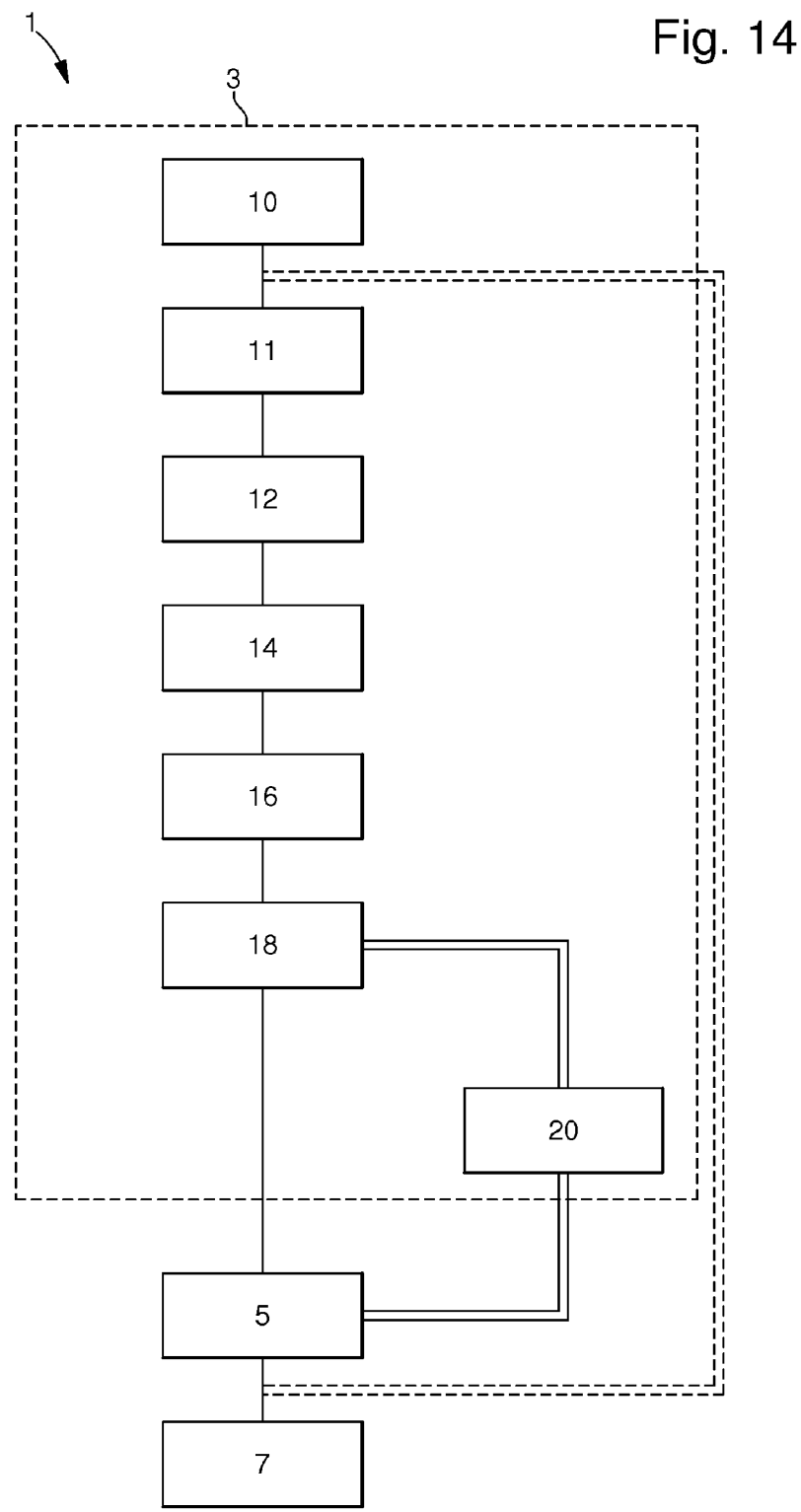
FIG. 14 is a flow chart of a method of fabricating a micromechanical component according to the invention.

As FIG. 14 shows, the invention relates to a method 1 of fabricating a composite micromechanical component 41, 41'. Method 1 preferably includes a preparation method 3 followed by galvanoplasty step 5 and step 7 of releasing the composite component 41, 41' thereby formed.

Preparation method 3 includes a series of steps for preparing a substrate 9, 9' made of at least partially micromachinable material, such as, preferably, silicon-based materials. Preparation method 3 is for facilitating the reception and growth of galvanic deposition step 5.

Figure 1:
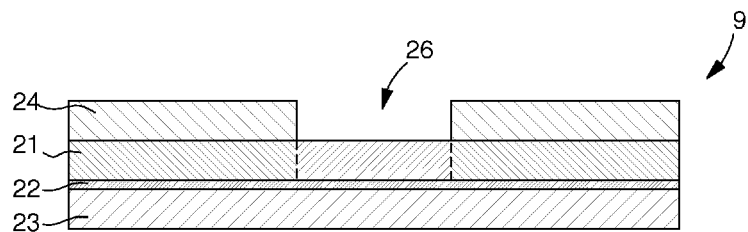
FIGS. 1 to 6 are diagrams of the successive steps of a method of fabricating a micromechanical component in accordance with a first embodiment of the invention.

A first step 10 of method 3 consists in taking a substrate 9 that includes a top layer 21 and a bottom layer 23, made of electrically conductive micromachinable material, and secured to each other by an electrically insulating, intermediate layer 22, as illustrated in FIG. 1.

Preferably, substrate 9 is a Silicon On Insulator (S.O.I). Thus, intermediate layer 22 is preferably made of silicon dioxide. Moreover, top layer 21 and bottom layer 23 are made of crystalline silicon, sufficiently doped for said layers to be electrically conductive.

According to the invention, method 3 includes a second step 11, consisting in structuring at least one protective mask 24 on conductive top layer 21 as illustrated in FIG. 1. As FIG. 1 also shows, mask 24 has at least one pattern 26 which does not cover top layer 21. This mask 24 may, for example, be obtained by photolithography using a positive or negative photosensitive resin.

In a third step 12, top layer 21 is etched until intermediate layer 22 is revealed. According to the invention, etching step 12 preferably includes a DRIE type anisotropic dry etch. The anisotropic etch is performed in top layer 21 in accordance with pattern 26 of mask 24.

Figure 2:
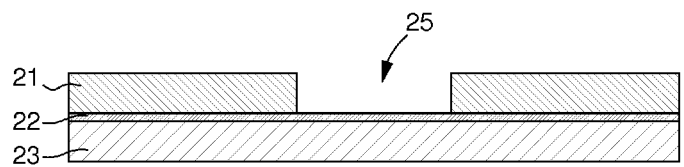

In a fourth step 14, mask 24 is removed. Thus, as visible in FIG. 2, at the end of fourth step 14, top layer 21 is etched over the entire thickness thereof with at least one cavity 25, thus forming a silicon part of at least one final composite component 41, 41'.

Figure 3:
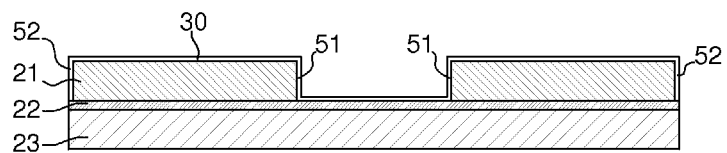

In a fifth step 16, an electrically insulating coating 30 is deposited, coating the entire top of substrate 9 as shown in FIG. 3. Preferably, coating 30 is obtained by oxidising the top of the etched top layer 21, and intermediate layer 22. As FIG. 3 shows, a silicon-dioxide layer is thus obtained both on the top of top layer 21 and intermediate layer 22 and on the vertical walls 51, 52 of top layer 21.

Figure 4:
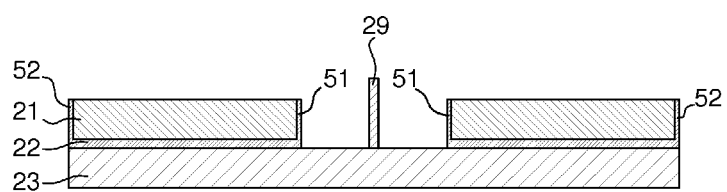

In accordance with a sixth step 18, a directional etch is performed on coating 30 and intermediate layer 22. Step 18 is for limiting the presence of insulating layers exclusively on each vertical wall formed in top layer 21, i.e. walls 51, 52 respectively of the exterior of the future composite component 41, 41' and said at least one cavity 25. According to the invention, during a directional or anisotropic etch, the vertical component of the etch phenomenon is favoured relative to the horizontal component, by modulating, for example the chamber pressure (very low pressure work), in a reactive ion type etch reactor. This etching may, for example, be "ion milling" or "sputter etching". As this step 18 is carried out and as shown in FIG. 4, it is clear that the bottom of cavity 25 is formed by electrically conductive bottom layer 23 and the top of substrate 9 is formed by top layer 21, which is also conductive.

In order to improve the adhesion of the subsequent galvanoplasty of step 5, an adhesion layer can be provided on the bottom of each cavity 25 and/or on the top of top layer 21. The adhesion layer could then consist of a metal such as the alloy CrAu.

Preferably, in sixth step 18, a pin 29 can also be assembled so as to form an arbour hole 42, 42' straight away for the composite micromechanical component 41, 41' in galvanoplasty step 5. This not only has the advantage of meaning that component 41, 41' does not require machining once the galvanoplasty has finished, but also means that an inner section of any shape can be made, whether uniform or not, over the entire top of hole 42, 42'. Pin 29 is preferably obtained, for example, via a photolithographic method using a photosensitive resin.

After step 18, preparation method 3 is finished and method 1 of fabricating the composite micromechanical component continues with galvanoplasty step 5 and step 7 of releasing said component.

Galvanoplasty step 5 is performed by connecting the deposition electrode to bottom layer 23 so as to grow an electrolytic deposition 33 in cavity 25.

Fabrication method 1 ends with step 7 in which the component formed by top layer 21 and the metal part deposited in cavity 25 is released from the rest of substrate 9, i.e. from bottom layer 23 and pin 29. According to this embodiment, it is clear that the micromechanical component obtained has a single level of identical shape over the entire thickness thereof which may include an arbour hole.

This micromechanical component could, for example, be an escape wheel, escapement pallets or even a pinion including a metal part at the arbour hole thereof which allows said micromechanical component to be driven in. Moreover, the external wall of the silicon part has a silicon dioxide layer with more advantageous features than those of silicon part 21, offering geometrical precision of the order of a micrometer.

Figure 5:
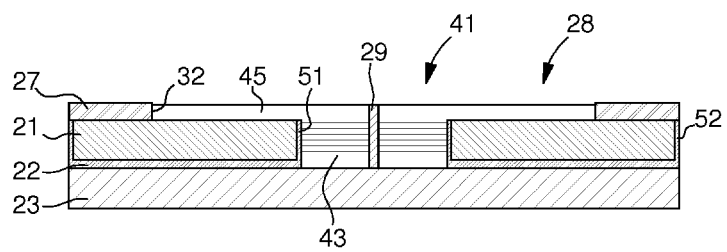

According to an alternative to this embodiment, illustrated by a double line in FIG. 14, after step 18, preparation method 3 includes an extra step 20 for forming at least a second level 45, 45' of the metal part 43 43', as illustrated in FIG. 5. Thus, second level 45, 45' is made by mounting a part 27, with electrically insulating walls 32, on top layer 21, which was not etched during step 12.

Preferably the added part 27 forms at least one recess 28 of larger section than the parts removed in accordance with pattern 26, for example via a photolithographic method using a photosensitive resin. However, part 27 could also include a silicon-based material that is pre-etched, and then secured to conductive layer 21.

Consequently, according to the alternative to the embodiment above, after step 20, preparation method 3 is finished and method 1 of fabricating the composite micromechanical component 41 continues with galvanoplastic step 5 and step 7 of releasing said component from substrate 9.

Galvanoplasty step 5 is performed by connecting the deposition electrode to bottom layer 23 so as to grow, firstly, an electrolytic deposition in cavity 25, and then, only secondly, in recess 28, as illustrated in FIG. 5.

Indeed, advantageously according to the invention, when the electrolytic deposition is flush with the top part of cavity 25, it electrically connects top layer 21 (or, possibly, its adhesion layer), which allows homogenous horizontal growth of the deposition in the whole of recess 28. Thus, the invention provides composite components 41 that have a first metal part 43 over the same thickness as top layer 21 and a second, projecting, metal part 45.

Advantageously, the second metal part 45 can have a high slenderness ratio, i.e. the section of cavity 25 can be much smaller than that of recess 28. Indeed, because of method 1, part 45 is fabricated avoiding any peeling off problems, even with a deposited metal such as nickel-phosphorus, containing for example, 12% phosphorus. This advantageous effect is due in part to the use of silicon as conductive layers 21, 23 (and possibly their adhesion layer), which decreases delamination phenomena at the interfaces.

According to the alternative of the above embodiment, fabrication method 1 ends with step 7, in which the formed component 41 is released, i.e. part 27 and pin 29 are removed and component 41 is removed from layers 22, 23 of substrate 9.

Figure 6:
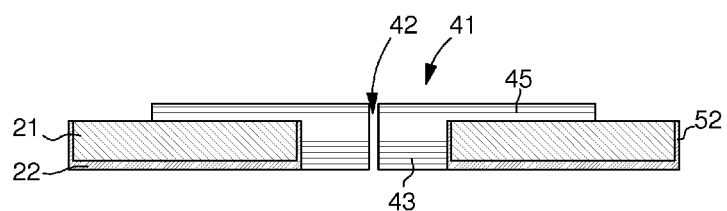
Figure 7:
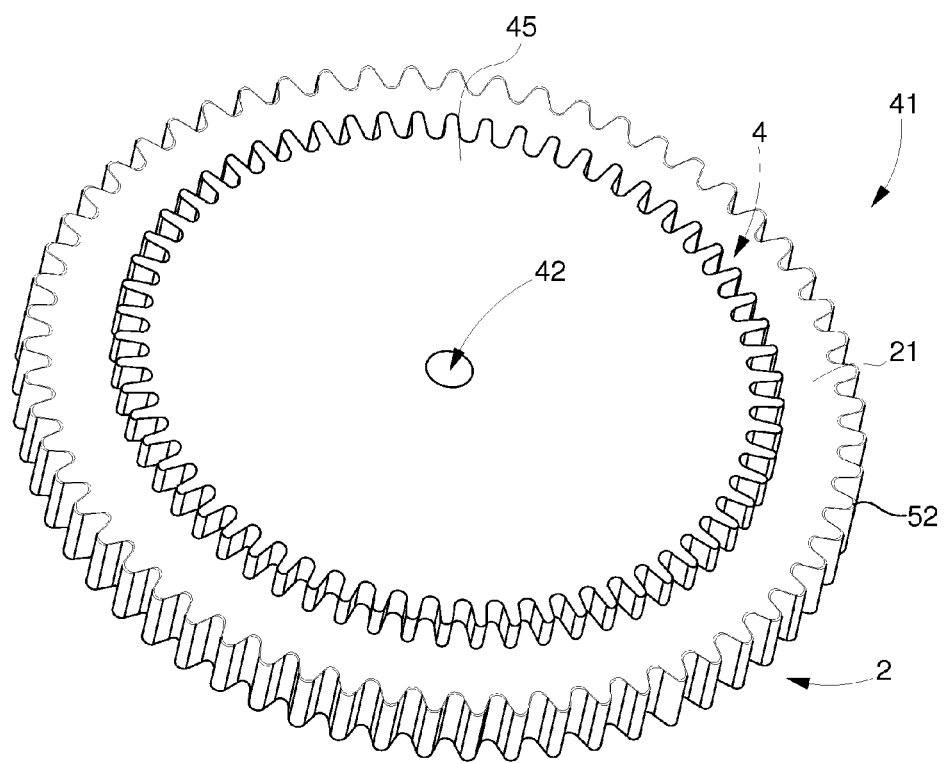
FIG. 7 is a micromechanical component according to a first embodiment of the invention.
Figure 8:
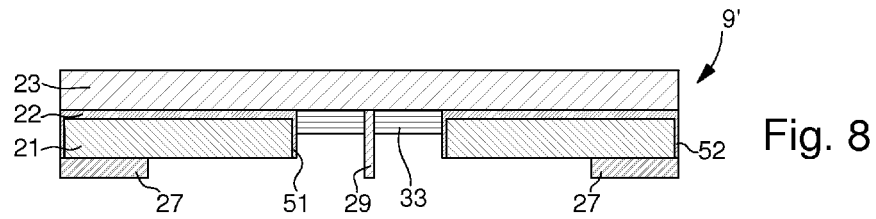
FIGS. 8 to 13 are diagrams of the successive steps of a method of fabricating a micromechanical component in accordance with a second embodiment of the invention.

It is clear that, as illustrated in FIGS. 6 and 7, the composite micromechanical component 41 obtained has two levels, each of different shape over a perfectly independent thickness and able to include a single arbour hole 42. The first level thus includes top layer 21, whose vertical walls 51, 52 are coated with silicon dioxide and whose inner cavity 25 receives a first part 43 of the galvanic deposition. The second level is formed exclusively by the second metal part 45, which extends as an extension of the first part 43 and projects from top layer 21. In the example illustrated in FIGS. 6 and 7, it will be noted that second part 45 also partially overlaps with top layer 21.

As FIGS. 6 and 7 show, micromechanical component 41 can consequently have the same first level as that obtained by the embodiment without step 20 and thus have geometrical precision of the order of a micrometer but also ideal referencing, i.e. perfect positioning between the two levels. Micromechanical component 41 can then form a wheel set including a toothed wheel 2 and a pinion 4 such as, for example, an escape wheel. According to the invention, the micromechanical component obtained is not limited to a wheel set. In a variant, it is perfectly possible to envisage obtaining pallets 2 with single block pallet stones coated with silicon dioxide and including a dart 4.

According to a second embodiment of method 1 (illustrated in double dotted lines in FIG. 14) partly representing a continuation of the embodiment already explained. As illustrated in FIGS. 8 to 13, it is thus possible to apply method 3 to bottom layer 23 as well, so as to add at least one or two other additional levels to said micromechanical component. To avoid overloading the Figures, a single example is detailed above, but it is clear that bottom layer 23 can also be transformed in accordance with the embodiment explained above with or without the alternative.

The steps of the second embodiment remain identical or similar to method 1 described above as far as step 18 or 20. In the example illustrated in FIGS. 8 to 13, we will take the embodiment example with the alternative step 20, illustrated in FIG. 5, as the starting point for method 1.

Preferably, according to this second embodiment, bottom layer 23 will be etched so as to form at least one second cavity 35. As can be seen, preferably between FIG. 5 and FIG. 8, a deposition 33 has been performed in one part of the first cavity 25 so as to provide a start layer for the second galvanoplasty. Preferably, this deposition 33 is carried out by starting step 5 up to a predetermined thickness. However, this deposition 33 can be performed in accordance with another method.

As illustrated by double dotted lines in FIG. 14 and FIGS. 8 to 13, the second embodiment of method 1 applies steps 11, 12, 14, 16 and 18 of the first embodiment of method 3 explained above to bottom layer 23.

Figure 9:
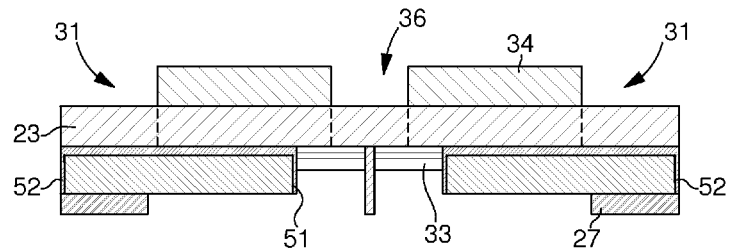

Thus, according to the second embodiment, method 3 includes a new step 11, consisting in structuring at least one mask 34 on conductive bottom layer 23 of substrate 9' as illustrated in FIG. 9. As FIG. 9 also shows, mask 34 has at least one pattern 36 and 31, which does not cover bottom layer 23. This mask 34 can, for example, be obtained by photolithography using a photosensitive resin.

Figure 10:
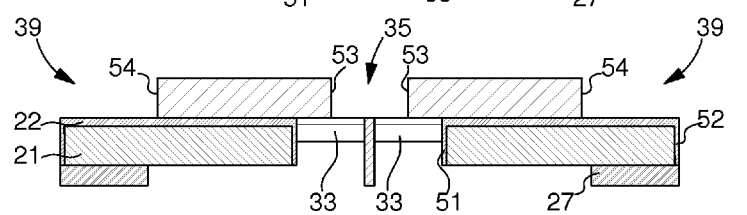

Next, in new step 12, layer 23 is etched in accordance with patterns 36 and 31 until electrically conductive deposition 33 and intermediate layer 22 are revealed. Then protective mask 34 is removed in a new step 14. Thus, as FIG. 10 shows, at the end of step 14, bottom layer 23 is etched over its entire thickness with at least one cavity 35 and 39.

Figure 11:
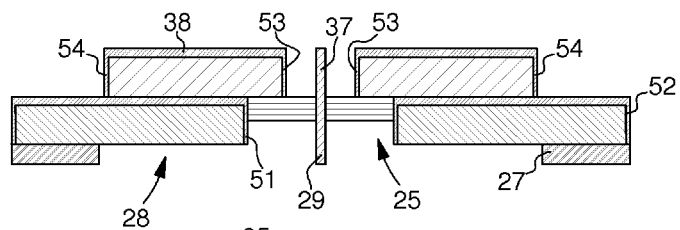

In a new step 16, an electrically insulating coating 38 is deposited, covering the whole of the bottom of substrate 9', as illustrated in FIG. 11. Preferably, coating 38 is obtained by depositing a silicon dioxide on the bottom of the bottom layer 23, for example using vapour phase deposition.

Preferably, in our example of FIGS. 8 to 13, a new step 18 is only performed for removing the oxide layer present in the bottom of said at least one cavity 35. However, if a second level is desired, a directional etch is performed on all the horizontal parts of coating 38. The new step 18 would then be for limiting the presence of the insulating layer exclusively at each vertical wall 53, 54 formed in bottom layer 23, i.e. the walls of the outside of the future component 41' and said at least one cavity 35.

In new step 18, as previously explained, a pin 37 can be assembled so as to form arbour hole 42' in micromechanical component 41' immediately in galvanoplasty step 5 with the same advantages mentioned above.

In the second embodiment of method 1, after step 18, preparation method 3 is finished and method 1 of fabricating the micromechanical component continues with galvanoplasty step 5 and step 7 of releasing composite component 41'. Preferably, if pins 29 and 37 are respectively formed in cavities 25 and 35, they are aligned. Moreover, pin 37 is, preferably, obtained via a photolithography method using a photosensitive resin.

Figure 12:
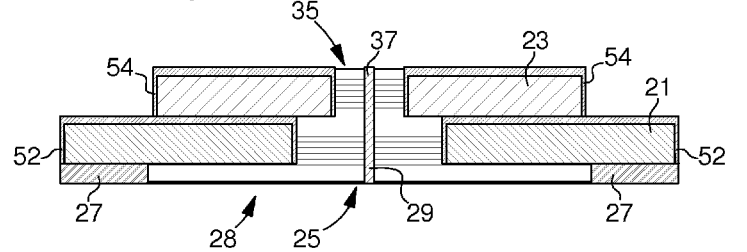

After new step 18 (or 20), galvanoplasty step 5 is performed by connecting the deposition electrode to bottom layer 23 so as to grow an electrolytic deposition in cavity 35 but also to continue the growth of the deposition in cavity 25, and then, only secondly, in recess 28, as illustrated in FIG. 12. In the case of the example illustrated in FIG. 12, to connect said electrode, it is thus, for example, possible to etch one part of the silicon dioxide layer 38 contained below top surface 23 in order to access it. One could also envisage directly connecting deposition 33.

Fabrication method 1 according to the second embodiment ends with step 7, in which component 41' is released, i.e. part 27 and pins 29, 37 are removed and component 41' is withdrawn from substrate 9'.

Figure 13:
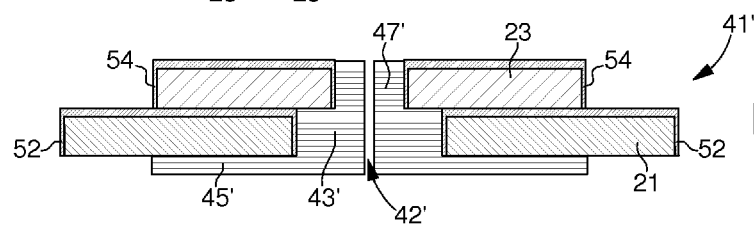

According to this second embodiment, it is clear, as illustrated in FIG. 13, that the composite micromechanical component 41' obtained has at least three levels, each of different shape over a perfectly independent thickness, and with a single arbour hole 42'. The first level thus includes top layer 21, whose internal walls 51, 52 are coated with silicon dioxide and whose inner cavity 25 receives a first part 43' of the galvanic deposition. The second level is formed exclusively by the second metal part 45', which extends as an extension of first part 43' and as a projecting portion from top layer 21. Finally, the third layer is formed by bottom layer 23, whose vertical walls 53, 54 are coated with silicon dioxide and whose inner cavity 35 receives a third part 47' of the galvanic deposition.

Micromechanical component 41' can consequently have the same first two levels as that obtained via the first embodiment with step 20. This micromechanical component 41' could, for example, be a coaxial escape wheel 21-52, 23-54 with its pinion 45' or a wheel set with three layers of teeth 21-52, 23-54, 45' with geometrical precision of the order of a micrometer, but also ideal referencing, i.e. perfect positioning between said levels.

Of course, this invention is not limited to the illustrated example but can have various variants and modifications, which will appear to those skilled in the art. Thus, several composite micromechanical components 41, 41' can be fabricated on the same substrate 9, 9' so as to achieve mass production of micromechanical components 41, 41', which are not necessarily identical to each other. Likewise, one could also envisage changing the silicon-based materials for crystallised alumina or crystallised silica or silicon carbide. One could also envisage insulating depositions 30 and/or 38 being different in nature and/or being each deposited via different methods from those explained above.

What is claimed is:

1. A method of fabricating a composite micromechanical component including the following steps:
   a) providing a substrate that includes a horizontal top layer and a horizontal bottom layer made of electrically conductive, micromachinable material, and secured to each other by an electrically insulating, horizontal, intermediate layer;
   b) etching at least one pattern in the top layer through to the intermediate layer, so as to form at least one cavity in the substrate that will form at least one part, made of micromachinable material, of the composite component;
   c) coating the top part of said substrate with an electrically insulating coating;
   d) directionally etching said coating and said intermediate layer so as to limit the presence thereof exclusively at each vertical wall formed in the top layer;
   e) performing an electrodeposition by connecting the electrode to the conductive bottom layer of the substrate to form at least one metal part of the composite component;
   f) releasing the composite component from the substrate.

2. The method according to claim 1, wherein one part is mounted after step d), above the top layer, to form at least one recess that communicates with said at least one cavity so as to form a second level of said component.

3. The method according to claim 1, wherein, prior to step e), it includes the following step:
   g) mounting a pin in said at least one cavity so as to form a hole in the future composite component.

4. The method according to claim 1, wherein step b) includes the following phases:
   h) structuring at least one protective mask on the conductive top layer;
   i) performing an anisotropic etch of said top layer in the parts that are not covered by said at least one protective mask;
   j) removing said at least one protective mask.

5. The method according to claim 1, wherein, prior to step f), it includes the following steps:
   b') etching a pattern in the bottom layer through to said metal part so as to form at least a second cavity in said substrate;
   c') coating the bottom part of said substrate with a second electrically insulating coating;
   e') performing an electrodeposition by connecting the electrode to the conductive bottom layer of the substrate so as to finish forming the metal parts of said component.

6. The method according to claim 5, wherein, after step c'), it includes the following step:
   d') directionally etching said second coating so as to reveal exclusively the bottom of the bottom layer.

7. The method according to claim 6, wherein a part is assembled after step d') so as to form at least one recess that communicates with said at least one second cavity offering said component an additional second level.

8. The method according to claim 5, wherein, prior to step e'), it includes the following step:
   g') mounting a pin in said at least one second cavity in the bottom layer so as to form a hole in the future composite component.

9. The method according to claim 5, wherein step b') includes the following phases:
   h') structuring at least one protective mask on the conductive bottom layer;
   i') performing an anisotropic etch of said bottom layer in the parts that are not covered by said at least one protective mask;
   j') removing the protective mask.

10. The method according to claim 1, wherein several composite micromechanical components are fabricated on the same substrate.

11. The method according to claim 1, wherein the conductive layers include a doped silicon-based material.

* * * * *